(12) United States Patent
Kennerly et al.

(10) Patent No.: US 10,354,871 B2
(45) Date of Patent: Jul. 16, 2019

(54) SPUTTERING SYSTEM AND METHOD FOR FORMING A METAL LAYER ON A SEMICONDUCTOR DEVICE

(71) Applicant: General Electric Company, Schenectady, NY (US)

(72) Inventors: Stacey Joy Kennerly, Schenectady, NY (US); Victor Torres, Schenectady, NY (US); David Lilienfeld, Niskayuna, NY (US); Robert Dwayne Gossman, Clifton Park, NY (US); Gregory Keith Dudoff, Schenectady, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/701,192

(22) Filed: Sep. 11, 2017

(65) Prior Publication Data

US 2019/0080906 A1    Mar. 14, 2019

(51) Int. Cl.
| | |
|---|---|
| *H01L 21/02* | (2006.01) |
| *H01L 21/04* | (2006.01) |
| *H01L 21/768* | (2006.01) |
| *H01L 23/532* | (2006.01) |
| *C23C 14/16* | (2006.01) |
| *H01L 21/285* | (2006.01) |

(52) U.S. Cl.
CPC ...... *H01L 21/02697* (2013.01); *C23C 14/165* (2013.01); *H01L 21/049* (2013.01); *H01L 21/28568* (2013.01); *H01L 21/76877* (2013.01); *H01L 23/53223* (2013.01)

(58) Field of Classification Search
None
See application file for complete search history.

(56) References Cited

U.S. PATENT DOCUMENTS

| | | | |
|---|---|---|---|
| 5,108,570 | A | 4/1992 | Wang |
| 5,869,901 | A * | 2/1999 | Kusuyama ........ H01L 21/32051 257/763 |
| 6,100,182 | A | 8/2000 | Lee et al. |
| 6,207,589 | B1 | 3/2001 | Ma et al. |
| 6,238,533 | B1 | 5/2001 | Satitpunwaycha et al. |
| 7,208,420 | B1 | 4/2007 | Mao et al. |

(Continued)

FOREIGN PATENT DOCUMENTS

EP    1 006 571 A2    6/2000

OTHER PUBLICATIONS

Skelly et al.,"Significant improvement in step coverage using bias sputtered aluminum", Journal of Vacuum Science & Technology A, vol. 4, Issue: 3, pp. 457-460, 1986.

(Continued)

*Primary Examiner* — Su C Kim
*Assistant Examiner* — David S Wilbert
(74) *Attorney, Agent, or Firm* — Fletcher Yoder, P.C

(57) ABSTRACT

A method for sputtering an aluminum layer on a surface of a semiconductor device is presented. The method includes three sputtering steps for depositing the aluminum layer, where each sputtering step includes at least one sputtering parameter that is different from a corresponding sputtering parameter of another sputtering step. The surface of the semiconductor device includes a dielectric layer having a plurality of openings formed through the dielectric layer.

12 Claims, 10 Drawing Sheets

(56) References Cited

U.S. PATENT DOCUMENTS

| | | | |
|---|---|---|---|
| 9,177,813 B2 | 11/2015 | Miura | |
| 2001/0019893 A1* | 9/2001 | Prall | H01L 21/76843 |
| | | | 438/689 |
| 2003/0062254 A1 | 4/2003 | Choi et al. | |
| 2005/0227445 A1 | 10/2005 | Boden, Jr. | |
| 2009/0170308 A1 | 7/2009 | Shim | |
| 2013/0062622 A1* | 3/2013 | Tsuchiya | H01L 29/7394 |
| | | | 257/77 |
| 2016/0133470 A1 | 5/2016 | Bordelon et al. | |
| 2017/0194438 A1* | 7/2017 | Kumagai | H01L 29/0865 |

OTHER PUBLICATIONS

International Search Report and Written Opinion issued in connection with corresponding PCT Application No. PCT/US2018/043026 dated Nov. 15, 2018.

* cited by examiner

SPUTTERING SYSTEM AND METHOD FOR FORMING A METAL LAYER ON A SEMICONDUCTOR DEVICE

BACKGROUND

The subject matter disclosed herein relates to semiconductor devices, and more specifically, to a sputtering process for forming a metal layer on a semiconductor device.

Power conversion devices are widely used throughout modern electrical systems to convert electrical power from one form to another form for consumption by a load. Many power electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors), in this power conversion process. Some semiconductor devices may include a plurality of cells (e.g., transistor cells) formed on a semiconductor substrate. During the fabrication of such semiconductor devices, one or more metal layers may be deposited on a surface of the semiconductor device (e.g., metallization) to electrically connect features of the semiconductor device to a lead of an external package. Generally, the metal layers are deposited over a surface of the semiconductor device that includes one or more steps, such as trenches and openings (e.g., contact vias), formed between different layers of the semiconductor device. The degree to which the metal layers cover the step features, which may be referred to as the step coverage, may affect the reliability of the semiconductor device.

For many power electronics systems, increasing the cell density of semiconductor devices may be desirable to increase the current capacity and/or to decrease the footprint of the semiconductor devices. Accordingly, it may be desirable to decrease the dimensions of the cells to enable more cells to be packed into the same area. However, decreasing the cell dimensions may cause challenges in the fabrication of semiconductor devices and their associated cells. In particular, as cell dimensions decrease, the dimensions of the trenches and openings in the stepped surface of the semiconductor device generally decrease, which may increase the difficulty in obtaining adequate step coverage, reducing the reliability of the semiconductor device.

In one embodiment, a semiconductor device includes a semiconductor device layer including a first surface and a second surface. The semiconductor device also includes a plurality of gate electrodes disposed on the first surface of the semiconductor device layer, wherein the plurality of gate electrodes are spaced apart from one another. Additionally, the semiconductor device includes a plurality of contact regions disposed in the first surface of the semiconductor device layer, wherein each contact region of the plurality of contact regions is disposed between adjacent gate electrodes of the plurality of gate electrodes. The semiconductor device also includes a dielectric layer disposed on and adjacent to each gate electrode of the plurality of electrodes. The dielectric layer includes a plurality of openings, wherein each opening of the plurality of openings is disposed over a contact region of the plurality of contact regions. Further, the semiconductor device includes an aluminum layer disposed on the dielectric layer. The aluminum layer extends into each opening of the plurality of openings of the dielectric layer such that the aluminum layer is disposed on the plurality of contact regions of the semiconductor device layer. A step coverage of the aluminum layer in each opening of the plurality of openings is greater than or equal to approximately 75%.

In one embodiment, a method includes sputtering a first portion of an aluminum layer on a surface of the semiconductor device disposed in a sputtering chamber. Sputtering the first portion of the aluminum layer includes supplying power to an aluminum target disposed in the sputtering chamber at a first power level using a target power supply, supplying a bias voltage to the semiconductor device at a first bias voltage level using a bias voltage supply, and supplying a sputtering gas into the sputtering chamber using a sputtering gas supply. Additionally, the method includes sputtering a second portion of the aluminum layer adjacent to the first portion of the aluminum layer. Sputtering the second portion of the aluminum layer includes supplying the power to the aluminum target at a second power level greater than the first power level using the target power supply, supplying the bias voltage to the semiconductor device at a second bias voltage level using the bias voltage supply, and supplying the sputtering gas into the sputtering chamber using the sputtering gas supply. Further, the method includes sputtering a third portion of the aluminum layer adjacent to the second portion of the aluminum layer. Sputtering the third portion of the aluminum layer includes supplying the power to the aluminum target to a third power level greater than the first power level using the target power supply, electrically floating the semiconductor device, and supplying the sputtering gas into the sputtering chamber using the sputtering gas supply.

In one embodiment, a power conversion system includes a semiconductor device including a semiconductor device layer having a first conductivity type. The semiconductor device layer has a first surface and a second surface. The semiconductor device also includes a plurality of source regions adjacent to the first surface, wherein each source region of the plurality of source regions has the first conductivity type. Additionally, the semiconductor device includes a plurality of well regions implanted adjacent to the first surface and the plurality of source regions, wherein each well region of the plurality of regions has a second conductivity type. Further, the semiconductor device includes a plurality of dielectric layers disposed on the first surface and electrically isolating a plurality of gate electrodes of the semiconductor device. The semiconductor device also includes a semiconductor substrate layer disposed adjacent to the second surface and a drain pad disposed adjacent to the semiconductor substrate layer. The semiconductor device also includes a gate pad disposed on the plurality of dielectric layers. The gate pad extends through one or more first openings formed through the plurality of dielectric layers to electrically connect to the plurality of gate electrodes of the semiconductor device. Further, the semiconductor device includes a source pad disposed on the plurality of dielectric layers and electrically isolated from the gate pad. The source pad extends through one or more second openings formed through the plurality of dielectric layers to electrically connect to a plurality of contact regions disposed in the first surface of the semiconductor device layer. Each contact region comprises a portion of at least one source region of the plurality of source regions, a portion of at least one well region of the plurality of well regions, or both. The source pad includes an aluminum layer that extends at least partially into the one or more second openings, and a step coverage of the aluminum layer in the one or more second openings is greater than or equal to approximately 80%.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
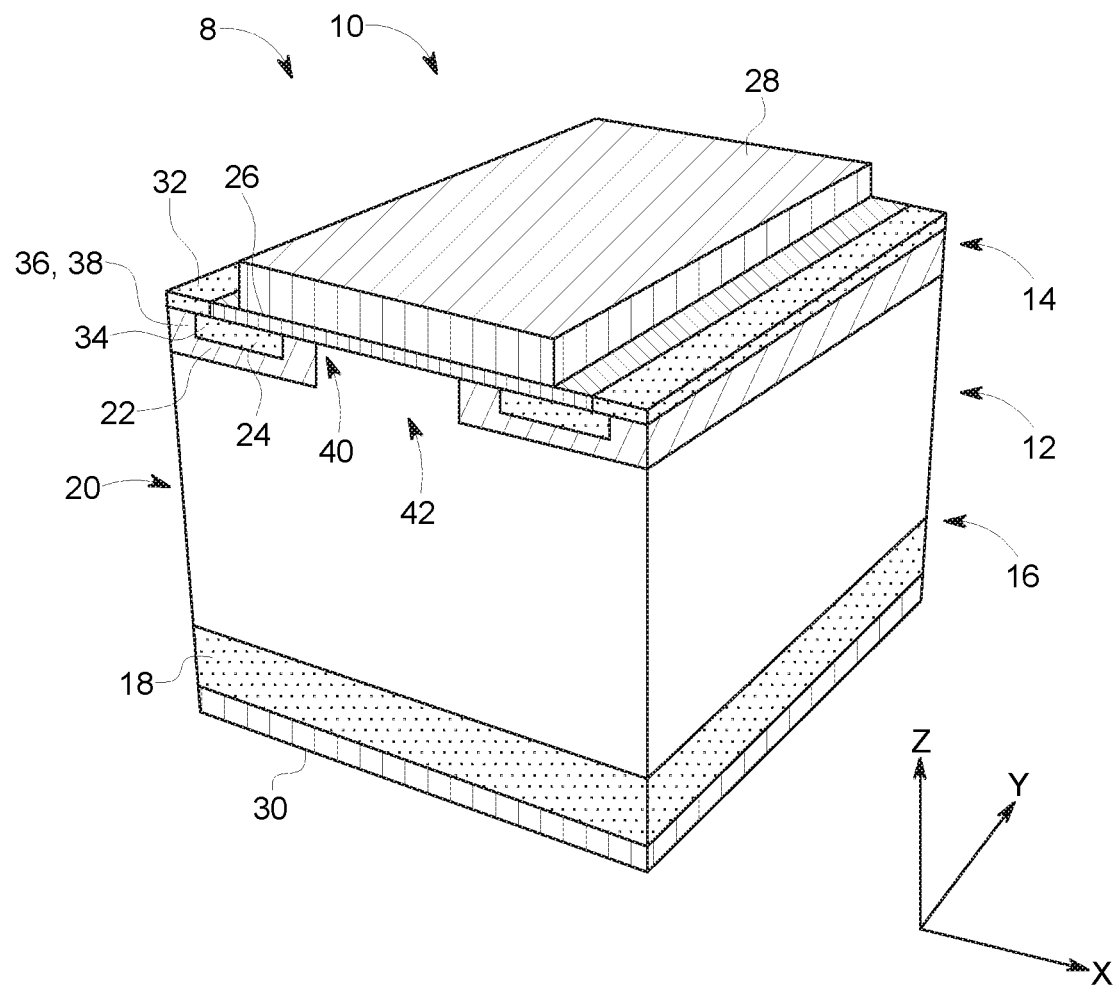
FIG. 1 is a schematic of a cell of a typical planar metal-oxide semiconductor field-effect transistor (MOSFET) device.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. If ranges are disclosed, the endpoints of all ranges directed to the same component or property are inclusive and independently combinable. The modifier "approximately" used in connection with a quantity is inclusive of the stated value and has the meaning dictated by the context (e.g., includes the degree of process variations or errors associated with measurement of the particular quantity).

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness unless otherwise specified. Furthermore, the term "a layer" as used herein refers to a single layer or a plurality of layers, unless the context clearly dictates otherwise. Further, as used herein, the phrases "disposed on," "sputtered on," or "deposited on" refer to layers disposed directly in contact with each other or indirectly by having intervening layers there between, unless otherwise specifically indicated. The term "adjacent" as used herein means that the two layers are disposed contiguously and are in direct contact with each other. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "lower," "middle," or "bottom" refer to a feature that is relatively nearer the substrate layer, while the terms "top" or "upper" refer to the particular feature that is relatively the farthest from the substrate layer.

Additionally, as used herein, the term "thickness" when used to describe a layer that is sputtered onto a surface refers to a dimension measured from a top portion of the surface on which the layer is sputtered. As used herein, the term "bottom thickness" when used to describe a layer that is sputtered onto a surface refers to a dimension measured from a bottom of a trench or opening formed in the surface. Further, as used herein, the term "step coverage" of a sputtered layer refers to a ratio or percentage of the bottom thickness of the sputtered layer relative to the thickness of the sputtered layer. As used herein, aluminum may refer to either substantially pure aluminum or aluminum alloys, such as aluminum alloys having copper (e.g., 0.5% copper), silicon (e.g., 1% silicon), or other suitable alloying components.

Semiconductor devices generally include device features that are formed by patterning. For example, during the fabrication of a semiconductor device, a layer of a material may be deposited on a surface of a semiconductor substrate (e.g., a semiconductor wafer) and portions of the layer may be selectively removed (e.g., via etching) to form a desired device feature. The deposition and removal steps are generally repeated to form multiple layers on top of one another and different device features in different layers. Additionally, openings (e.g., vias) may be formed through one or more layers to provide interconnection between the layers. As a result, the semiconductor device may include a surface (e.g., a top surface) having a complex, stepped topography. For example, the surface may include one or more steps, such as trenches (e.g., grooves, troughs, recesses, valleys, etc.), peaks (e.g., protrusions, hills, etc.), and/or openings (e.g., vias, holes, apertures, etc.) through one or more layers of the semiconductor device.

After the desired device features have been formed, the semiconductor device is metallized using a metal deposition process, such as chemical vapor deposition (CVD) or physical vapor deposition (PVD), which is also referred to as sputtering. In particular, one or more metal layers (e.g., aluminum layers) may be deposited on the stepped surface of the semiconductor device to electrically connect various device features of the semiconductor device (e.g., source contact, gate electrode, drain contact, etc.) to an external structure. For example, the one or more metal layers may extend from the stepped surface of the semiconductor device to various device features located below the stepped surface through openings formed through insulating layers of the semiconductor device. Additionally, portions of the one or more metal layers may be selectively etched to form contact areas (e.g., contact pads, runners, buses, etc.). Wires may be bonded to the contact pads to electrically connect the contact pads, and by extension the device features electrically connected to the contact pads, to an external structure, such as leads of an external package.

The degree to which the metal layers cover the steps (e.g., the step coverage) of the stepped surface can affect the reliability of the semiconductor device. CVD may be used to achieve a desired step coverage on a stepped surface. However, CVD is often undesirable due to its relatively slow deposition rate. Sputtering is generally preferred due to its comparatively fast deposition rate relative to CVD. However, as cell dimensions decrease, it becomes increasingly difficult to obtain adequate step coverage using sputtering techniques. Accordingly, different sputtering techniques have been explored for improving the step coverage of the metal layers. However, these techniques generally involve some trade-off in the reliability of the wire bonds that are formed with/on the metal layers in exchange for the improved step coverage.

With the foregoing in mind, the present embodiments are directed to sputtering techniques that improve the reliability of semiconductor devices. In particular, the disclosed sputtering techniques improve the reliability of semiconductor devices by improving the step coverage of the metal layers while maintaining or improving the reliability of the wire bonds formed on the metal layers as compared to conventional sputtering techniques. For example, as discussed below, the disclosed sputtering techniques include a multi-step process for depositing an aluminum layer on a surface, where the multi-step process includes at least three steps that each deposit a portion of the aluminum layer. Additionally, as discussed below, each step of the three steps is implemented using at least one sputtering parameter that is different from a corresponding sputtering parameter of the other two steps. As such, as discussed below, the three portions of the aluminum layer that are formed by implementing the three steps of the multi-step process may have different characteristics (e.g., grain size, grain uniformity, hardness, step coverage, etc.) from one another, which enables the fabrication of an aluminum layer having improved step coverage and maintained or improved wire bond reliability and bond strength as compared to aluminum layers formed using conventional sputtering techniques.

Accordingly, embodiments of the present disclosure generally relate to sputtering methods for metallizing semiconductor devices. It should be appreciated that while the present technique is discussed herein in the context of metal-oxide-semiconductor field-effect transistors (MOSFETS), the present techniques may be applicable to other types of semiconductor device structures, such as diodes, thyristors, transistors (e.g., insulated gate bipolar transistor (IGBT), bipolar transistor (BJT), junction field-effect transistor (JFET), metal-semiconductor field-effect transistor (MESFET), etc.) or any other suitable device utilizing metallization. Further, semiconductor devices of the present approach may be manufactured from any suitable semiconductor materials, such as silicon (Si), silicon carbide (SiC), germanium (Ge), aluminum nitride (AlN), gallium nitride (GaN), gallium arsenide (GaAs), diamond (C), for example. Further, it should be appreciated that while the present approach is discussed herein in the context of depositing source metallization over a trench between two gate electrodes, the present approach may be applicable to any suitable metallization (e.g., source, gate, and/or drain) over any suitable surface including stepped portions, planar portions, angled portions, and/or curved portions. Still further, while the following discussion relates to a discrete semiconductor package (e.g., a package including a single MOSFET device), the present techniques may also be applicable to metallizing one or more surfaces of a multi-chip package or module including two or more semiconductor devices electrically connected to one another.

With the foregoing in mind, FIG. 1 illustrates an embodiment of a cell 8 of a planar n-channel field-effect transistor, namely a DMOSFET, hereinafter MOSFET device 10. It may be appreciated that, in order to more clearly illustrate certain components of the MOSFET device 10, certain design elements of the MOSFET device 10 (e.g., top metallization, passivation, edge termination, and so forth) may be omitted. The top metallization of the MOSFET device 10 may be fabricated using the presently disclosed sputtering techniques and will be described in more detail below with respect to FIGS. 2-11.

The illustrated MOSFET device 10 of FIG. 1 includes a semiconductor device layer 12 (e.g., an epitaxial SiC layer) having a first surface 14 (e.g., a top surface or an upper surface) and a second surface 16 (e.g., a bottom surface or a lower surface). As illustrated, the second surface 16 of the semiconductor device layer 12 is disposed above and adjacent to a substrate layer 18. The semiconductor device layer 12 includes a drift region 20 having a first conductivity type (e.g., an n-type drift region 20) and a well region 22 having a second conductivity type (e.g., a p-type well region 22) disposed adjacent to the drift region 20 and proximal to the first surface 14. The semiconductor device layer 12 also includes a source region 24 having the first conductivity type (e.g., n-type source region 24) adjacent to the well region 22 and proximal to the first surface 14. A dielectric layer 26 (also referred to as a gate insulating layer, a gate dielectric layer, or a gate oxide layer) is disposed above and adjacent to a portion of the first surface 14 of the semiconductor device layer 12. In particular, the dielectric layer 26 is disposed above and adjacent to a portion of the well region 22 and the source region 24. Additionally, a gate electrode 28 is disposed above and adjacent to the dielectric layer 26. Further, a drain contact 30 is disposed below and adjacent to the substrate layer 18.

Additionally, as illustrated in FIG. 1, a source contact 32 (also referred to as an ohmic contact) is disposed above and adjacent to a portion of the first surface 14 of the semiconductor device layer 12. In particular, the source contact 32 is disposed above and adjacent to a portion of the well region 22 and the source region 24. For clarity, the portion of the source region 24 disposed below the source contact 32 may be more specifically referred to herein as a source contact region 34. Similarly, a portion of the well region 22 (e.g., p-type well region 22) of the MOSFET device 10 may be more specifically referred to herein as a body region 36 (e.g., p+ body region 36). Additionally, the portion of the body region 36 that is disposed below and adjacent to the source contact 32 may be more specifically referred to herein as a body contact region 38 (e.g., p+ body contact region 38). During operation, an appropriate gate voltage (e.g., at or beyond a threshold voltage ($V_{TH}$) of the MOSFET device 10) may cause an inversion layer to form in the channel region 40, as well as a conductive path to form in the junction gate field-effect transistor (JFET) region 42, allowing current to flow between the source contact 32 and the drain contact 30.

Figure 2:
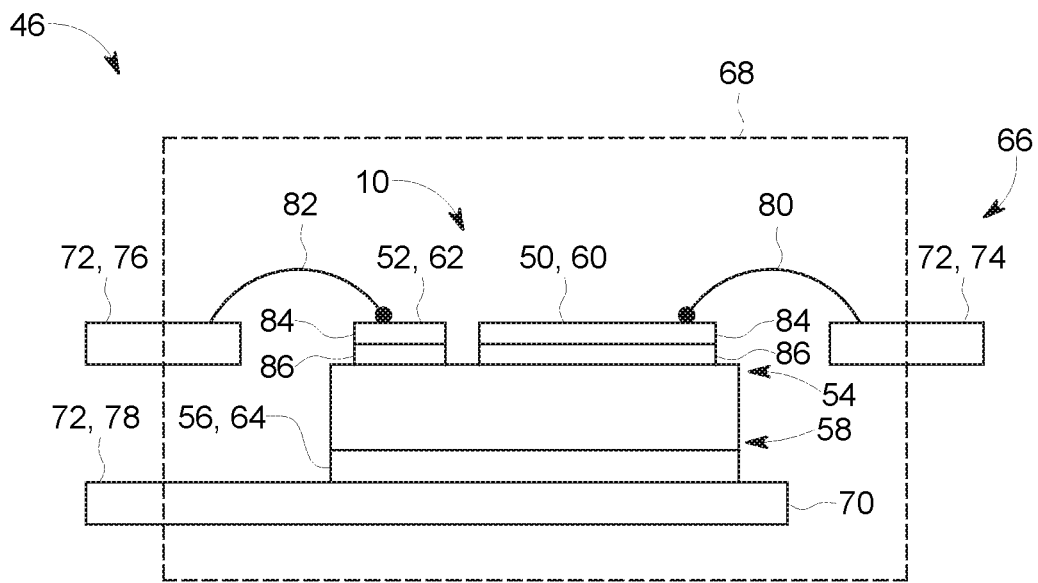
FIG. 2 is a schematic of an embodiment of a power conversion system including a semiconductor packaging having the MOSFET device of FIG. 1.

FIG. 2 illustrates a schematic of an embodiment of a power conversion system 46 including the MOSFET device 10. As illustrated, the MOSFET device 10 includes source metallization 50 and gate metallization 52 disposed on and adjacent to a first surface 54 (e.g., a top surface) of the MOSFET device 10. As discussed below, the source metallization 50 and the gate metallization 52 may be formed by depositing (e.g., sputtering) one or more metal layers on the first surface 54 of the MOSFET device 10. Additionally, the MOSFET device 10 includes drain metallization 56 disposed on and adjacent to a second surface 58 (e.g., a bottom surface) of the MOSFET device 10. The drain metallization 56 may include one or more metal layers deposited on and/or coupled to the second surface 58 (e.g., the substrate layer 18).

As illustrated, the source metallization 50 includes a source pad 60 (also referred to as a source contact pad or a source bond pad), the gate metallization 52 includes a gate pad 62 (also referred to as a gate contact pad or a gate bond pad), and the drain metallization 56 includes a drain pad 64 (also referred to as a drain contact pad or a drain bond pad). It should be appreciated that FIG. 2 illustrates an example configuration or layout of the source metallization 50, the gate metallization 52, and the drain metallization 56, and the location, size, and shape of the source metallization 50, the gate metallization 52, and the drain metallization 56 may vary in other embodiments. For example, in some embodiments, the source metallization 50 and the gate metallization 52 may at least partially overlap with one another and may be electrically isolated from one another by one or more dielectric layers disposed between the source metallization 50 and the gate metallization 52. Further, while the source metallization 50, the gate metallization 52, and the drain metallization 56 each include one respective pad in the illustrated embodiment, it should be appreciated that the source metallization 50, the gate metallization 52, and the drain metallization 56 may each include any number of pads, as well as one or more busses (also referred to as runners) coupled to one or more of the pads.

As will be appreciated, the source, gate, and drain metallization 50, 52, and 58 of the MOSFET device 10 are electrically coupled to or includes (e.g., is integrally formed with) its associated contacts (e.g., the source contacts 32, the gate electrodes 28, or the drain contacts 30) of the cells 8 of the MOSFET device 10. For example, in some embodiments, the source metallization 50 and the gate metallization 52 may extend through vias (e.g., openings) formed in one or more insulating layers of the MOSFET device 10 to electrically connect to (e.g., directly contact) the source contacts 32 and the gate electrodes 28, respectively. In some embodiments, the source metallization 50 may include the source contacts 32. For example, one or more metal layers of the source metallization 50 may be used to form the source contacts 32.

As illustrated, the MOSFET device 10 may be packaged within a semiconductor package 66 (e.g., a power package or power module). While the semiconductor package 66 illustrated in FIG. 2 includes only one MOSFET device 10, it should be appreciated that the semiconductor package 66 may include two or more MOSFET devices and/or may include two or more different types of semiconductor devices (e.g., the MOSFET device 10 and a diode). The semiconductor package 66 includes a lead frame 68 having at least one die pad 70 and a plurality of leads 72. Each of the plurality of leads 72 may be electrically isolated from one another.

The plurality of leads 72 may include at least a source lead 74, a gate lead 76, and a drain lead 78. In some embodiments, the drain lead 78 may be coupled to or integral with the die pad 70. As illustrated, the drain pad 64 of the MOSFET device 10 may be coupled to (e.g., disposed on) the die pad 70. For example, the drain pad 64 may be soldered to the die pad 70 or coupled to the die pad 70 using a conductive adhesive. Accordingly, the drain pad 64 may be electrically coupled to the drain lead 78 via the die pad 70. Additionally, the source pad 60 and the gate pad 62 may be electrically coupled to the source lead 74 and the gate lead 76, respectively, via source and gate wires 80 and 82, respectively. The source and gate wires 80 and 82 may be coupled to the source and gate pads 60 and 62, respectively, via wire bonding, such as ball bonding, wedge bonding, or compliant bonding. While not illustrated, it should be appreciated that the semiconductor package 66 may be integrated with circuitry of the power conversion system 46 to provide a desired function. For example, the semiconductor package 66 may be coupled to a power source and a load of the power conversion system 46, and the semiconductor package 66 (e.g., using the MOSFET device 10) of may convert power received from the power source (e.g., convert alternating current (AC) power to direct current (DC) power or vice versa) and may output the converted power to the load.

As noted above, the source metallization 50 and the gate metallization 52 may be formed by depositing (e.g., sputtering) one or more metal layers on the first surface 54 of the MOSFET device 10. In some embodiments, the source metallization 50 and the gate metallization 52 may be formed simultaneously by sputtering one or more metal layers on the first surface 54 and subsequently patterning and etching the deposited metal layers to form the source metallization 50 and the gate metallization 52 (e.g., to form the source pad 60 and the gate pad 62 and any associated busses). In some embodiments, the source metallization 50 and the gate metallization 52 may be separately formed. Further, in some embodiments, the source metallization 50 and/or the gate metallization 52 may include an aluminum layer 84, and the source wire 80 and/or the gate wire 82 may be wire bonded to the aluminum layer 84. In some embodiments, the aluminum layer 84 may be formed from only aluminum (e.g., a pure aluminum layer 84). In certain embodiments, the aluminum layer 84 may be disposed adjacent to the surface 54. In other embodiments, the source metallization 50 and/or the gate metallization 52 may include a second metal layer 86 (e.g., a barrier metal layer) disposed between and adjacent to the surface 54 and the aluminum layer 84. The second metal layer 86, which may include one or more metal layers, may be formed from one or more metals, such as titanium, nickel, copper, gold, tungsten, platinum, lead, zinc, silver, palladium, iron, chromium, cobalt, any other suitable metal, or any alloy combining two or more metals together. In some embodiments, as discussed below, the second metal layer 86 may be a titanium layer.

Figure 3:
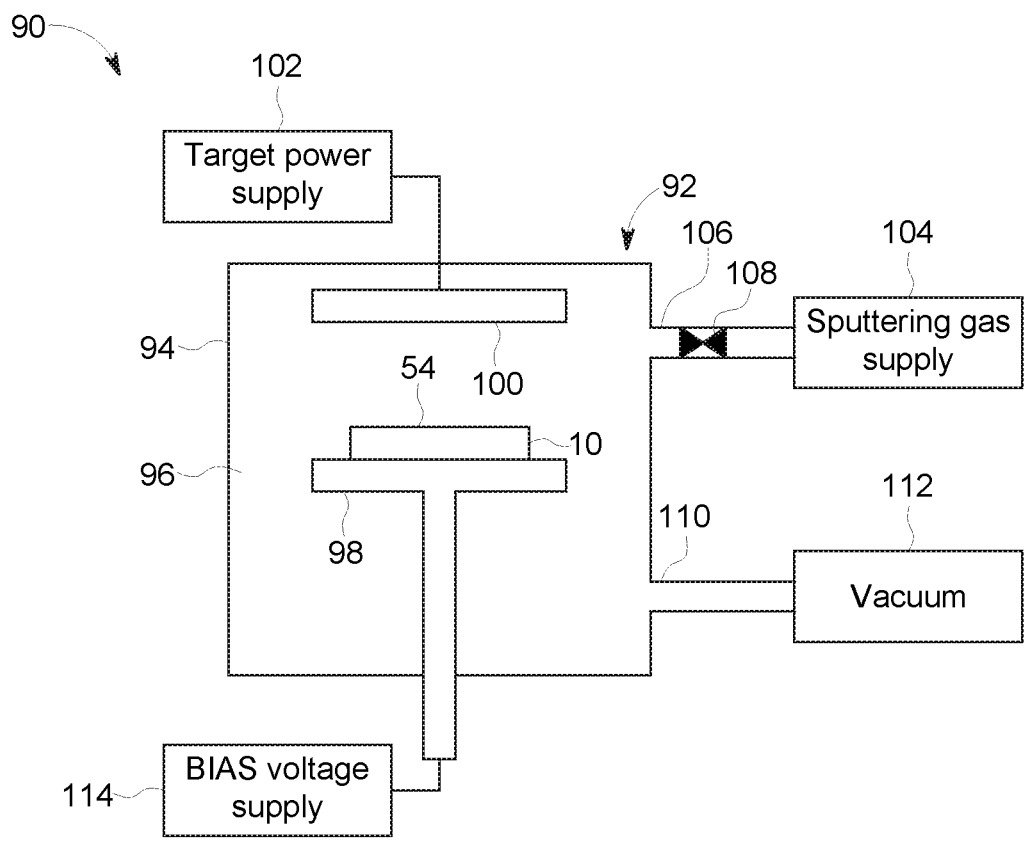
FIG. 3 is a schematic of a physical vapor deposition (PVD) system that may be used to deposit a metal layer on a surface of a semiconductor device, in accordance with certain embodiments of the present approach.
Figure 4:
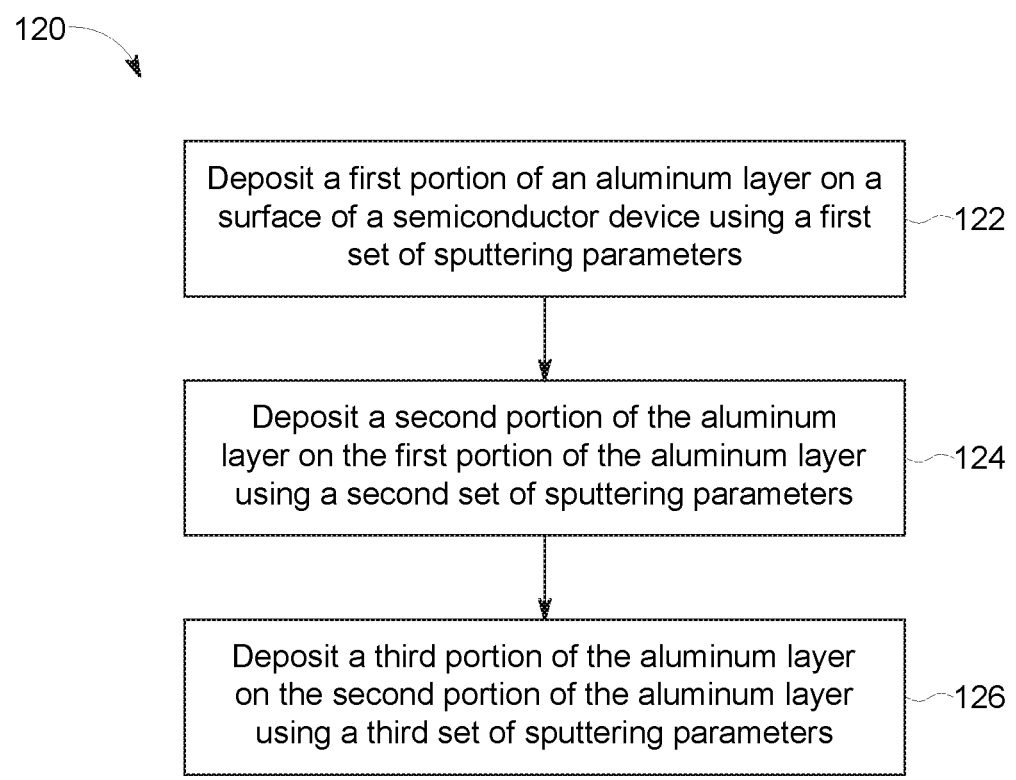
FIG. 4 is a flow diagram illustrating a method for depositing an aluminum layer on a surface of a semiconductor device, in accordance with certain embodiments of the present approach.

FIG. 3 illustrates an embodiment of a PVD system 90 that may be used to sputter one or more metal layers on a surface of a semiconductor device. For example, the PVD system 90 may be used to sputter the aluminum layer 84 and/or the second metal layer 86 on the surface 54 of the MOSFET device 10 to form the source metallization 50 and/or the gate metallization 52 illustrated in FIG. 2. As noted above, it may be difficult to obtain adequate step coverage using conventional sputtering techniques when depositing a metal layer on a surface including stepped features, such as trenches and/or vias. Additionally, as noted above, conventional sputtering techniques generally involve some trade-off in the reliability and wire bond strength of wires (e.g., the source wire 80 and the gate wire 82) bonded to the metal layer (e.g., aluminum layer 84 of the source pad 60 and/or the gate pads 62) in exchange for the improved step coverage. Accordingly, FIG. 4 illustrates a method 120 for depositing an aluminum layer on a surface of a semiconductor device using at least three aluminum sputtering steps to improve step coverage while maintaining or improving the reliability and bond strength of wire bonds as compared to conventional sputtering techniques. As discussed below, the method 120 may be used to fabricate the aluminum layer 84 of the source metallization 50 and/or the gate metallization 52.

Returning to FIG. 3, the PVD system 90 includes a PVD device 92 configured to sputter one or more metal layers, such as the aluminum layer 84 and/or the second metal layer 86, on the surface 54 of the MOSFET device 10. As illustrated, the PVD device 92 includes a housing 94 and a sputtering chamber 96 disposed within the housing 94. Additionally, the PVD device 92 includes a support member 98 disposed in the sputtering chamber 96 and coupled to the housing 94. The support member 98 is configured to support the MOSFET device 10 or any other suitable semiconductor device or semiconductor wafer. Further, the PVD system 90 includes a target 100 (e.g., a metal target) disposed in the sputtering chamber 96 and a target power supply 102 electrically coupled to the target 100. In particular, the target 100 is coupled to a cathode or negative terminal of the target power supply 102. The target 100 is generally electrically isolated from the housing 94. It should be appreciated that the PVD system 90 may be used with different targets 90 to form different metal layers. For example, the PVD system 90 may utilize a titanium target 100 to form a titanium layer, an aluminum layer 90 to form an aluminum layer, and so forth.

Additionally, the PVD system 90 includes a sputtering gas supply 104 (e.g., working gas supply) configured to supply a sputtering gas (e.g., working gas) to the sputtering chamber 96 through an inlet port 106 through the housing 94. The sputtering gas may include argon gas or any other suitable inert gas. In some embodiments, the PVD system 90 may include a valve 108 (e.g., a throttle valve, a check valve, etc.) configured to control the flow of the sputtering gas into the sputtering chamber 96. Further, the PVD device 92 may include a port 110 (e.g., an outlet port) coupled to a vacuum 112 (e.g., a vacuum pump, a cryogenic pump, a turbo pump, roughing pump). Additionally, the PVD system 90 may include a bias voltage supply 114 (e.g., wafer bias voltage supply 114) electrically coupled to the support member 98 and configured to supply a bias voltage to the support member 98 and thus the MOSFET device 10 disposed on the support member 98. Other conventionally understood components of the PVD system 90, such as heaters, coolers, structures for moving the support member 98, and so forth, are not shown in FIG. 3 for simplicity.

During operation, the MOSFET device 10 may be set on the support member 98, and the sputtering chamber 96 may be evacuated using the vacuum 112. In some embodiments, the sputtering chamber 96 may be evacuated to an initial pressure that is less than or equal to approximately $1 \times 10^{-7}$ Torr (T). The sputtering gas supply 104 may supply a sputtering gas, such as argon gas, to the sputtering chamber 96 through the inlet port 106. The valve 108 may be adjusted or controlled (e.g., by an operator and/or by an electronic controller) to control the flow rate of the sputtering gas into the sputtering chamber 96 and the pressure within the sputtering chamber 96. In some embodiments, a valve opening of the valve 108 may be adjusted between 0% and 100%, where the valve 108 is substantially or completely closed at a 0% valve opening and the valve 108 is substantially or completely open at a 100% valve opening. Additionally, the pressure within the sputtering chamber 96 may be controlled using the vacuum 112. In some embodiments, the sputtering gas supply 104 may be configured to supply the sputtering gas with a variable pressure and/or flow rate, and the sputtering gas supply 104 may be controlled (e.g., by an operator and/or by an electronic controller) to control the pressure within the sputtering chamber 96.

The target power supply 102 supplies power to the target 100, which energizes the sputtering gas to create sputtering gas ions. The sputtering gas ions impinge upon or collide with the target 100, which may sputter (e.g., dislodge) atoms or particles (e.g., metal particles, aluminum particles, titanium particles, etc.) from the target 100. The sputtered metal particles may then be deposited on the MOSFET device 10. Additionally, during the sputtering process, the bias power supply 114 may supply a bias voltage to the MOSFET device 10 to electrically bias the MOSFET device 10 relative to the housing 94. When no bias voltage is supplied to the MOSFET device 10, the MOSFET device 10 may be referred to as electrically floating or having an electrically floating potential. It may be appreciated that, during sputtering, deposition generally occurs as metal particles leave the target 100, impact the MOSFET device 10, and adsorb onto the surface of the device 10. The bias voltage generates an electric field (e.g., a secondary electric field) that attracts or directs ions (e.g., gas ions) within the sputtering chamber 96 toward the MOSFET device 10. These ions impact the surface of the device 10, applying additional kinetic energy to the recently adsorbed metal particles, enabling the metal particles to move slightly across the surface of the device 10 into less heavily bombarded areas (e.g., vias, topography corners). It is presently recognized that, since the atoms can reach more energetically favorable locations on the surface of the device 10, this increased kinetic energy improves the step coverage at the surface of the device 10. In other words, since the adsorbed metal particles are not confined to their initial point of contact with the surface of the device 10, the sputtered metal film forms substantially evenly along the surface of the device 10 as a result of a suitable bias voltage.

Additionally, it is also presently recognized that, in certain embodiments, the device 10 may specifically be negatively biased to promote the aforementioned ion impacts to promote substantially even metal film deposition.

The target power supply 102 may be configured to supply power to the target 100 over a range of power levels and voltage levels. Accordingly, the target power supply 102 may be adjusted or controlled (e.g., by an operator and/or by an electronic controller) to supply power to the target 100 at a desired power level and a desired voltage level. In some embodiments, the target power supply 102 may be designed or rated to output a maximum power level and/or a maximum voltage level. In some embodiments, the maximum power level of the target power supply 102 may be less than or equal to approximately 20 kilowatts (kW) (e.g., 19 kW, 18 kW, 17 kW, 16 kW, 15 kW, 14 kW, 13 kW, 12 kW, or 11.9 kW). Similarly, the bias voltage supply 104 may be configured to supply a bias voltage to the MOSFET device 10 over a range of voltages, and the bias voltage supply 104 may be adjusted or controlled (e.g., by an operator and/or by an electronic controller) to supply a voltage to the MOSFET device 10 at a desired voltage level. Further, the bias voltage supply 104 may be designed or rated to output a maximum voltage level. In some embodiments, the maximum voltage level of the bias voltage supply 104 may be less than or equal to approximately 500 volts (V) (e.g., 400 V, 350 V, or 300 V).

Returning now to FIG. 4, the method 120 for depositing an aluminum layer on a surface of a semiconductor device is illustrated. For example, the method 120 may be used to deposit the aluminum layer 84 of the source metallization 50 (e.g., the source pad 60) and/or the aluminum layer 84 of the gate metallization 52 (e.g., the gate pad 62). It should be appreciated that the method 120 may be implemented using the PVD system 90 of FIG. 3 or any other suitable PVD (e.g., sputtering) system. To better illustrate the method 120, FIGS. 5-8 illustrate an embodiment of the MOSFET device 10 at various stages during execution of the method 120. However, it should be appreciated that while the following discussion is directed to the MOSFET 10, the present technique may be applicable to any other suitable semiconductor device where an aluminum layer is desired or utilized. It should be noted that the features of the MOSFET 10 illustrated in FIGS. 5-8 are not drawn to scale.

Figure 5:
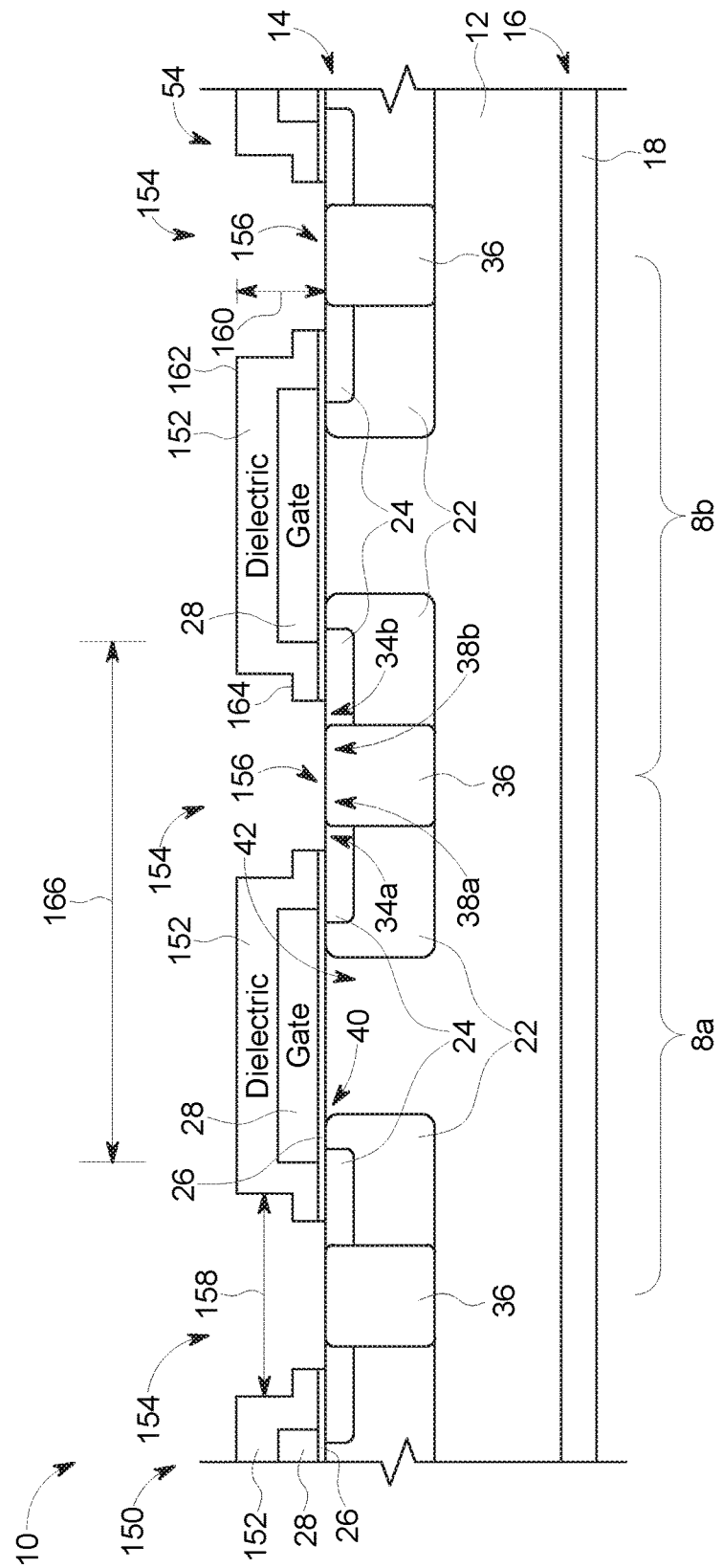
FIG. 5 is a schematic of an embodiment of an active area of the MOSFET device as an example of a semiconductor device structure prior to the execution of the methods of FIG. 4 or 9.

FIG. 5 illustrates a schematic of an embodiment of the MOSFET device 10 prior to the method 120. In particular, FIG. 5 illustrates a portion of the MOSFET device 10 from an active area 150 (e.g., active region) of the MOSFET device 10 including a plurality of adjacent cells 8. Specifically, FIG. 5 depicts two full cells 8 (e.g., a first cell 8a and a second cell 8b) disposed adjacent to one another and two partial cells disposed adjacent to the first cell 8a and the second cell 8b.

As illustrated in FIG. 5, and also in FIG. 1, each cell 8 includes the gate electrode 28 (e.g., a metal gate or a polysilicon gate), which is deposited atop portions of the semiconductor device layer 12. In particular, the gate electrode 28 is disposed over the channel region 40 and the JFET region 42 of each cell 8. Additionally, the gate electrode 28 is disposed over portions of the well region 22 and the source region 24 of each cell 8. Further, each gate electrode 28 is separated from the semiconductor device layer 12 by the dielectric layer 26, which is hereinafter referred to as the gate oxide layer 26 for clarity. Additionally, a second dielectric layer 152, which is hereinafter referred to as an interlayer dielectric (ILD) 152, is deposited on top of each gate electrode 28.

As illustrated, the gate oxide layer 26 and the ILD layer 152 only cover portions of the first surface 14 of the semiconductor device layer 12. In particular, the gate oxide layer 26 and the ILD layer 152 may be conventionally formed by depositing the respective dielectric layer on the first surface 14 of the semiconductor device layer 12 and subsequently patterning and etching desired portions of the respective dielectric layers to expose desired portions of the first surface 14 of the semiconductor device layer 12. More specifically, the gate oxide layer 26 and the ILD layer 152 may be patterned and etched to create a plurality of openings 154 (e.g., vias or trenches) in the gate oxide layer 26 and the ILD layer 152 to expose a plurality of contact regions 156 of the semiconductor device layer 12.

Each contact region 156 may include portions two adjacent (e.g., neighboring) cells 8. For example, as illustrated, the contact region 156 between the first cell 8a and the second cell 8b includes the source contact region 34a and the body contact region 38a of the first cell 8a and the source contact region 34b and the body contact region 38b of the second cell 8b. As illustrated, portions of the ILD layer 152 of each cell 8 extend past the edges of the gate electrode 28 of the respective cell 8 and contact portions of the semiconductor device layer 12 surrounding the respective gate electrode 28 (e.g., the source region 24 of the semiconductor device layer 12) to electrically isolate the respective gate electrode 28 from the contact regions 156. Accordingly, the stepped surface 54 of the MOSFET device 10 in the active area 150 illustrated in FIG. 5 includes two types of surfaces: a dielectric surface (e.g., the portions of the ILD layer 152 disposed on the gate electrodes 28 and the semiconductor device layer 12) a metal surface (e.g., the contact regions 156 of the semiconductor device layer 12).

Each opening 154 generally includes a width 158 that extends from the ILD layer 152 of one cell 8 (e.g., a portion of the ILD layer 152 disposed above a gate electrode 28 of a cell 8) to the ILD layer 152 of an adjacent cell 8 (e.g., a portion of the ILD layer 152 disposed above a gate electrode 28 of an adjacent cell 8). Additionally, each opening 154 generally includes a height 160 that extends from the contact region 156 of the semiconductor device layer 12 (e.g., top surface 14 of the semiconductor device layer 12) to a top surface 162 of the ILD 152. In some embodiments, each opening 154 of the plurality of openings 154 may include substantially the same shape and/or dimensions (e.g., width 158 and height 160). In other embodiments, two or more openings 154 of the plurality of openings 154 may be differently shaped and/or may have at least one different dimensions (e.g., width 158 and/or height 160). In some embodiments, the width 158 of one or more openings 154 may be substantially constant along the height 160 of the respective opening 154. In other embodiments, the width 158 of one or more openings 154 may vary (e.g., increase and/or decrease) along the height 160 of the respective opening 154 gradually and/or in a step-wise manner. For example, in the illustrated embodiment, the ILD layer 152 of each cell 8 includes stepped portions 164 disposed adjacent to the first surface 14 of the semiconductor device layer 12 such that the width 158 decreases in a step-wise manner from the top surface 162 of the ILD layer 152 to the first surface 14.

In some embodiments, the width 158 of the openings 154 may be correlated to the cell pitch of the MOSFET device 10. For example, the width 158 may vary with the cell pitch. As used herein, the cell pitch is the distance between a feature in one cell of the semiconductor device and the same feature in an adjacent (i.e., neighboring) cell of the semiconductor device. For example, FIG. 5 illustrates a cell pitch 166 of the MOSFET device 10 measured between the gate electrode 28 of the first cell 8a and the gate electrode 28 of the second cell 8b. In some embodiments, the cell pitch 166 may be less than or equal to approximately 10 micrometers (µm) (e.g., 9 µm, 8.5 µm, 8 µm, 7.5 µm, 7 µm, 6.5 µm, 6 µm, 5.5 µm, 5 µm, 4.5 µm, 4 µm, 3.5 µm, 3 µm, or less). In certain embodiments, the cell pitch 166 may be between approximately 4 µm and approximately 10 µm, between approximately 4.25 µm and approximately 8.25 µm, between approximately 4.5 µm and approximately 8 µm, or between approximately 4.7 µm and approximately 7.8 µm. Further, in certain embodiments, the width 158 of the openings 154 may be less than or equal to approximately 4 µm (e.g., 3.5 µm, 3 µm, 2.5 µm, 2.25 µm, 2 µm, 1.75 µm, 1.5 µm, 1 µm, 0.75 µm, 0.5 µm or less). Further, in some embodiments, a ratio of the height 160 of an opening 154 to the width 158 of the respective opening 154 (also referred to as an aspect ratio) may be between approximately 1:1 and approximately 5:1 (e.g., between approximately 1:1 and approximately 2:1, between approximately 1.1:1 and approximately 1.2:1). For example, in certain embodiments, the aspect ratio may be between approximately 2:1 and approximately 5:1 or between approximately 2.5:1 and approximately 4:1.

Figure 6:
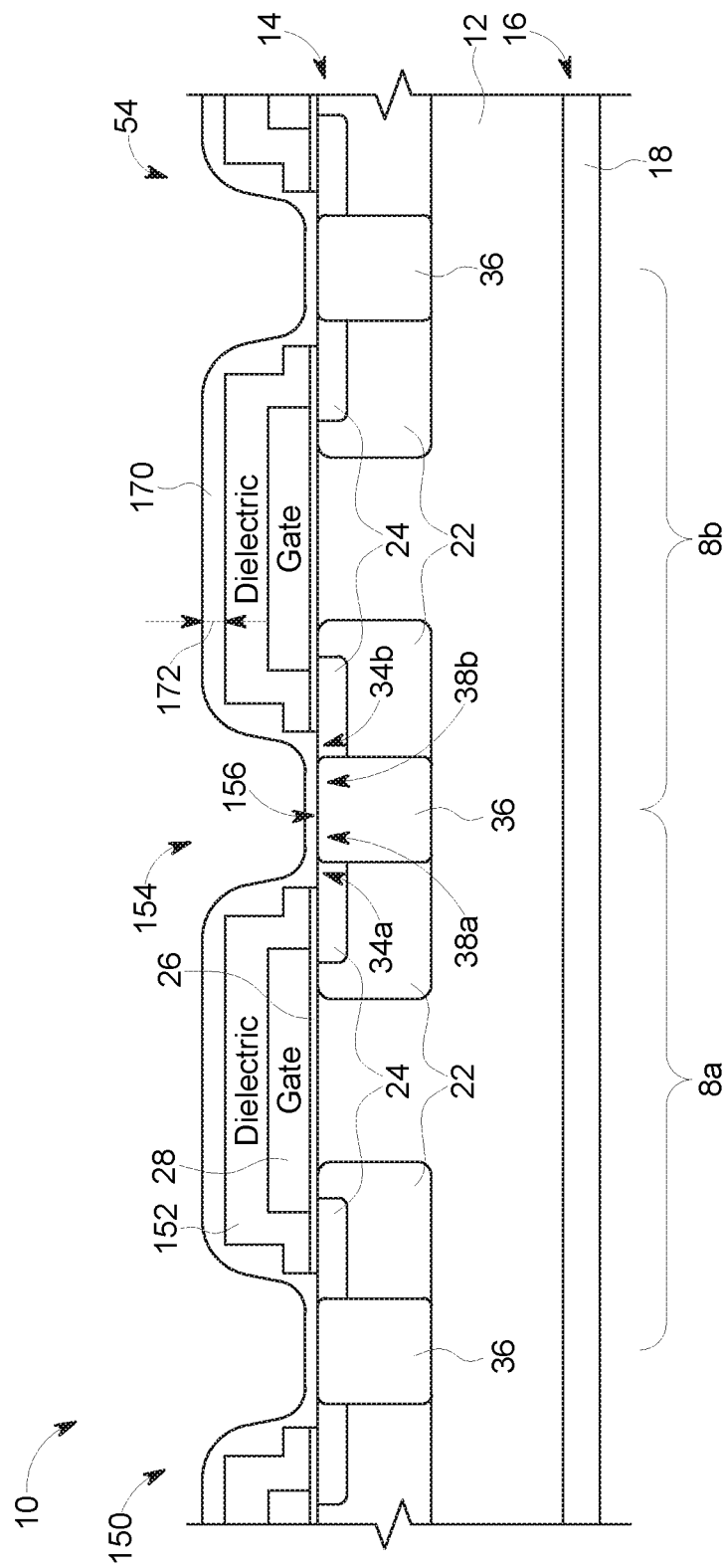
FIG. 6 is the MOSFET device embodiment of FIG. 5 after depositing a first portion of an aluminum layer on a surface of the MOSFET device, as set forth in the method of FIG. 4.

Turning back to FIG. 4, the illustrated method 120 includes depositing (block 122) a first portion of an aluminum layer (e.g., the aluminum layer 84) on the surface 54 of the MOSFET device 10 using a first set of sputtering parameters. In some embodiments, the first portion of the aluminum layer 84 may be deposited (block 122) directly on the surface 54 of the MOSFET device 10. For example, the resulting structure, illustrated by the MOSFET device of FIG. 6, includes a first aluminum layer portion 170 disposed adjacent to (e.g., conformally deposited over) the surface 54 of the MOSFET device 10. In particular, the first aluminum layer portion 170 is disposed adjacent to the ILD layer 152 (e.g., portions of the ILD layer 152 adjacent to the gate electrodes 28 and portions of the ILD layer 152 adjacent to the semiconductor device layer 12) and in openings 154 formed in the ILD layer 152. More specifically, the first aluminum layer portion 170 is disposed adjacent to regions of the semiconductor device layer 12 exposed through the openings 154 of the ILD layer 152 (e.g., the contact regions 156 of the semiconductor device layer 12). As illustrated in FIG. 6, the first aluminum layer portion 170 may have a first thickness 172. In some embodiments, the first thickness 172 may between approximately 0.25 µm and approximately 0.75 µm or between approximately 0.4 µm and approximately 0.6 µm. In certain embodiments, the first thickness 172 may be approximately equal to 0.5 µm.

In some embodiments, the first set of sputtering parameters of the deposition step 122 of the method 120 of FIG. 4 may include a first power level supplied to the target 100 using the target power supply 102, a first bias voltage supplied to the MOSFET device 10 using the bias voltage supply 104, a first pressure within the sputtering chamber 96, and/or a first valve opening percentage of the valve 108. In other words, depositing (block 122) the first aluminum layer portion 170 may include supplying the first power level to the target 100 (e.g., an aluminum target) using the target power supply 102 and supplying the first bias voltage to the MOSFET device 10 disposed in the sputtering chamber 96 on the support structure 88 using the bias voltage supply 104. Additionally, depositing (block 122) the first aluminum layer portion 170 may include supplying a sputtering gas (e.g., argon gas) to the sputtering chamber 96 at a pressure and/or flow rate to adjust an initial pressure of the sputtering chamber 96 (e.g., an evacuated pressure, such as $1\times10^{-7}$ Torr (T)) to the first pressure using the sputtering gas supply 104. In some embodiments, depositing (block 122) the first aluminum layer portion 170 may include adjusting a valve opening percentage of the valve 108 to the first valve opening percentage to adjust the initial pressure of the sputtering chamber 96 to the first pressure. As discussed above, the target 100 energizes the sputtering gas to create sputtering gas ions, which may collide with the target 100 to sputter aluminum atoms or particles from the target 100. The sputtered aluminum particles may then be deposited on the MOSFET device 10 to create the first aluminum layer portion 170.

In certain embodiments, the first power level may be less than the maximum power level of the target power supply 102. In some embodiments, the first power level may be between approximately 40% and approximately 90%, approximately 50% and approximately 85%, or between approximately 60% and approximately 80% of the maximum power level of the target power supply 102. In certain embodiments, the first power level may greater than or equal to approximately 7 kW (e.g., 7.5 kW, 8 kW, 8.5 kW, 9 kW, or 9.5 kW). For example, the first power level may be between approximately 7 kW and approximately 9.5 kW.

In some embodiments, the first bias voltage may be approximately equal to the maximum bias voltage of the bias voltage supply 104. In certain embodiments, the first bias voltage may be at least approximately 75%, 80%, 85%, 90%, 95%, 97%, or 99% of the maximum bias voltage of the bias voltage supply 104. In some embodiments, the first bias voltage may be greater than or equal to approximately 250 V, 275 V, or 300 V.

Further, in some embodiments, the first pressure of the sputtering chamber 96 may be less than or equal to approximately 5 mT (e.g., 4.5 mT, 4 mT, 3.5 mT, or 3 mT). In certain embodiments, the first pressure of the sputtering chamber 96 may be between approximately 2 mT and approximately 4 mT, between approximately 2.5 mT and approximately 3.5 mT, between approximately 2.75 mT and approximately 3.25 mT, or approximately 3 mT. Additionally, in some embodiments, the first valve opening percentage of the valve 108 may be between approximately 30% and approximately 60%, between approximately 35% and approximately 55%, between approximately 40% and approximately 50%, or approximately 45%. By using the first set of sputtering parameters, the first aluminum layer portion 170 may have a good conformal coating over the surface 54 and may have a uniform grain structure and/or grain size, which may prevent or minimize voids in aluminum layer portions formed on top of the first aluminum layer portion 170.

Figure 7:
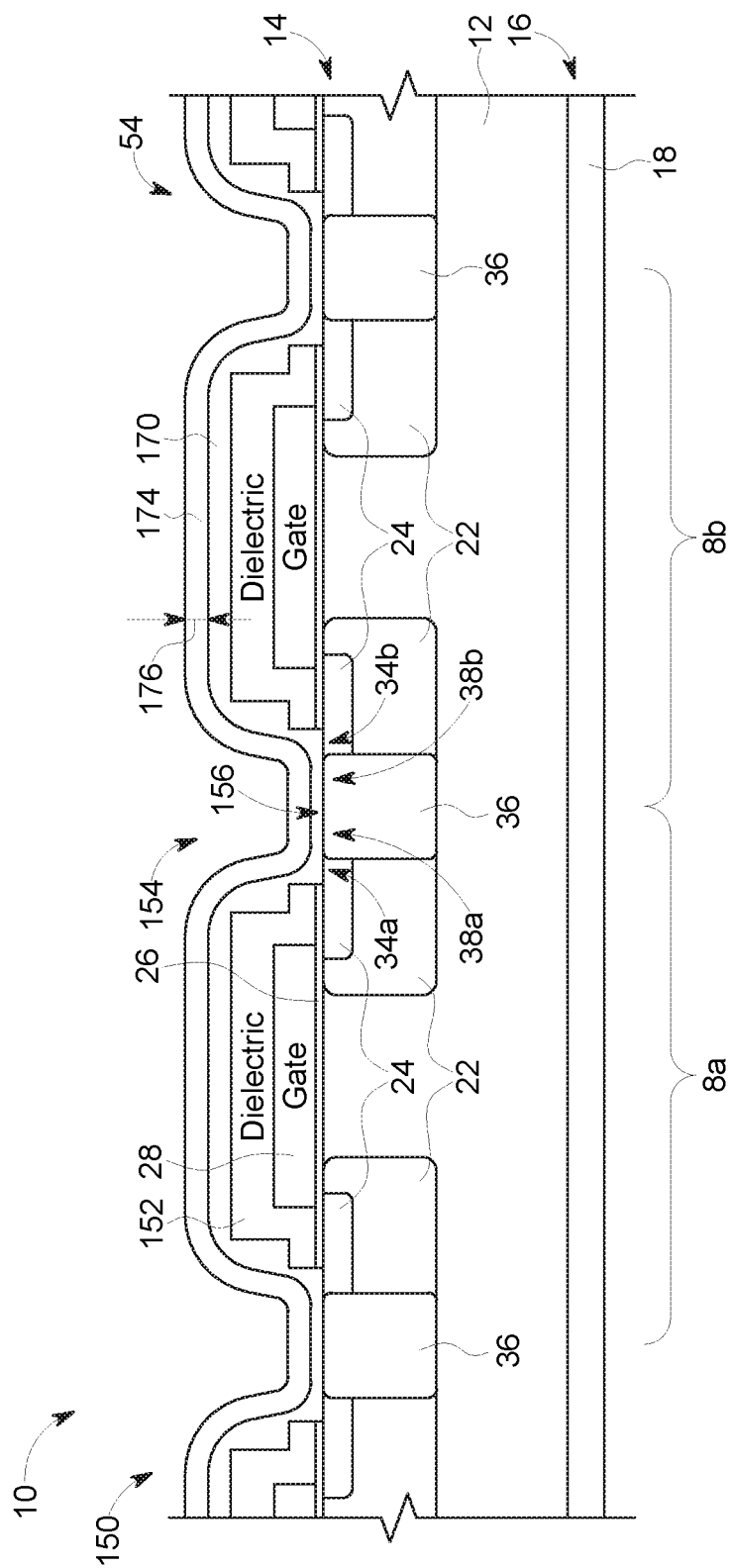
FIG. 7 is the MOSFET device embodiment of FIG. 5 after depositing a second portion of the aluminum layer on the first portion of the aluminum layer, as set forth in the method of FIG. 4.

Turning back to FIG. 4, the illustrated method 120 includes depositing (block 124) a second portion of the aluminum layer 84 directly on the first portion of the aluminum layer 84 using a second set of sputtering parameters. The resulting structure, illustrated by the MOSFET device of FIG. 7, includes a second aluminum layer portion 174 disposed adjacent to (e.g., conformally deposited over) the first aluminum layer portion 170. As illustrated in FIG. 7, the second aluminum layer portion 174 may have a second thickness 176. In some embodiments, the second thickness 176 may be greater than the first thickness 172. In certain embodiments, the second thickness 176 may between approximately 1.25 µm and approximately 1.75 µm, between approximately 1.4 µm and approximately 1.6 µm, or approximately equal to 1.5 µm.

In general, at least one sputtering parameter of the second set of sputtering parameters is different from a corresponding sputtering parameter of the first set of sputtering parameters. By using at least one different sputtering parameter, the first and second aluminum layer portions 170 and 174 may have one or more different characteristics. For example, in some embodiments, the second set of sputtering parameters of the deposition step 124 of the method 120 of FIG. 4 may include a second power level supplied to the target 100 using the target power supply 102 that is greater than the first power level of the first set of sputtering parameters of the deposition step 122. In some embodiments, the second power level may be at least approximately 20%, 30%, 40%, 50%, 60%, or 70% greater than the first power level. In certain embodiments, the first power level may be between approximately 50% and approximately 80% of the second power level. Further, in some embodiments, the second power level may be at least approximately 75%, 80%, 85%, 90%, 95%, 97%, or 99% of the maximum power level of the target power supply 102 or may be approximately equal to the maximum power level of the target power supply 102. In certain embodiments, the second power level may be between approximately 11 kW and approximately 13 kW, between approximately 11.5 kW and approximately 12 kW, or approximately 11.9 kW. The increased power level may increase the energy of the sputtering gas ions and the sputtered aluminum atoms. As a result, the second aluminum layer portion 174 may have an improved step coverage as compared to the first aluminum layer portion 170.

In some embodiments, the second set of sputtering parameters of the deposition step 124 of the method 120 of FIG. 4 may include a second bias voltage, a second pressure within the sputtering chamber 96, and/or a second valve opening percentage of the valve 108. In certain embodiments, the second bias voltage, the second pressure within the sputtering chamber 96, and/or the second valve opening percentage of the valve 108 may be approximately equal to the first bias voltage, the first pressure within the sputtering chamber 96, and/or the first valve opening percentage of the valve 108, respectively. That is, in some embodiments, the bias voltage, the pressure within the sputtering chamber 96, and/or the valve opening percentage of the valve 108 used to implement the first deposition step 122 may not be adjusted to implement the second deposition step 124. In other embodiments, the second bias voltage, the second pressure within the sputtering chamber 96, and/or the second valve opening percentage of the valve 108 may be different from (e.g., greater than or less than) the first bias voltage, the first pressure within the sputtering chamber 96, and/or the first valve opening percentage of the valve 108, respectively. By using the second set of sputtering parameters, the second aluminum layer portion 174 may have small aluminum grains and good grain size uniformity, which may enable a good conformal coating that can improve the potential step coverage of the aluminum layer formed by the method 120.

Turning back to FIG. 4, the illustrated method 120 includes depositing (block 126) a third portion of the aluminum layer 84 on the second portion of the aluminum layer 84 using a third set of sputtering parameters. The resulting structure, illustrated by the MOSFET device of FIG. 8, includes a third aluminum layer portion 178 disposed adjacent to (e.g., conformally deposited over) the second aluminum layer portion 174. As illustrated, the third aluminum layer portion 178 may have a third thickness 180. In some embodiments, the third thickness 180 may be greater than the first thickness 172 and the second thickness 176. In certain embodiments, the third thickness 180 may between approximately 1.75 μm and approximately 2.25 μm, between approximately 1.9 μm and approximately 2.1 μm, or approximately equal to 2 μm.

In some embodiments, the first, second and third aluminum layer portions 170, 174, and 178 together form the aluminum layer 84 of the MOSFET device 10. That is, the third aluminum layer portion 178 is an outermost portion of the aluminum layer 84 relative to the substrate layer 12 of the MOSFET device 10. Accordingly, the aluminum layer 84 may have a thickness 184, which may be a sum of the thicknesses 172, 176, and 180 of the first, second and third aluminum layer portions 170, 174, and 178, respectively. In some embodiments, the thickness 184 may be between approximately 3 μm and approximately 5 μm, approximately 3.5 μm and approximately 4.5 μm, or approximately equal to 4 μm.

As illustrated, the aluminum layer 84 may be disposed adjacent to and electrically connected to the contact regions 156 of the semiconductor device layer 12. In such embodiments, portions of the aluminum layer 84 (e.g., portions of the aluminum layer 84 adjacent to the contact regions 156) may function as and be referred to as the source contacts 32 of the MOSFET device 10. In other words, the aluminum layer 84 may include or may be integral with the source contacts 32. In other embodiments, the source contacts 32 may be formed separately from the aluminum layer 84. For example, it may be desirable to form the source contacts 32 from one or more metals other than aluminum, such as nickel or titanium. Accordingly, in such embodiments, the source contacts 32 may be disposed adjacent to the contact regions 156 of the semiconductor device layer 12, and the aluminum layer 84 may be disposed on and adjacent to the source contacts 32. More specifically, the first aluminum layer portion 170 may be deposited directly on the source contacts 32.

Figure 8:
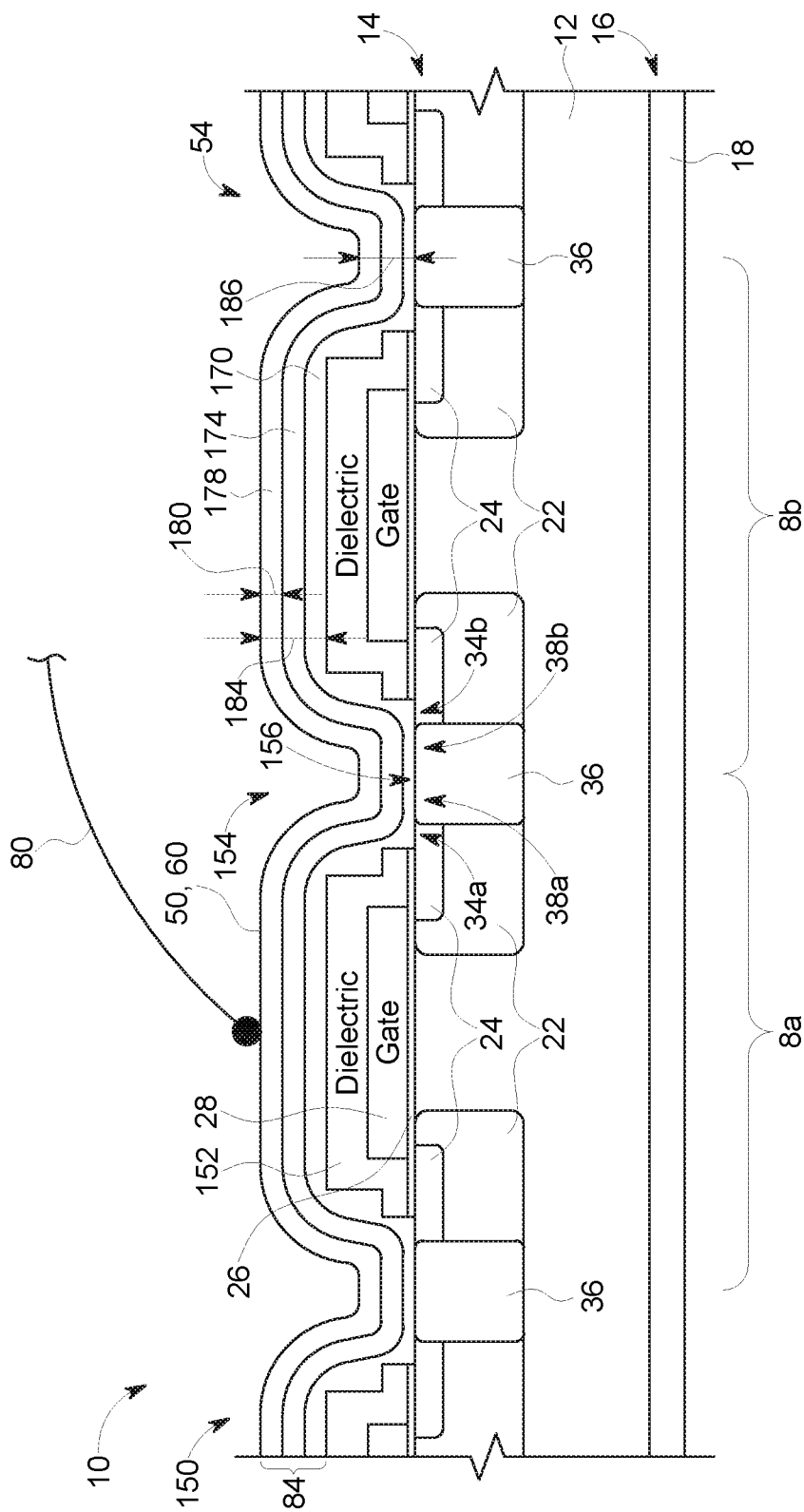
FIG. 8 is the MOSFET device embodiment of FIG. 5 after depositing a third portion of the aluminum layer on the second portion of the aluminum layer, as set forth in the method of FIG. 4.

Additionally, the aluminum layer 84 illustrated in FIG. 8 is electrically isolated from the gate electrodes 28 of the MOSFET device 10 via the ILD layer 152. Accordingly, the aluminum layer 84 illustrated in FIG. 8 (e.g., a portion of the aluminum layer 84 in the active area 150) may be referred to as the source metallization 50 of the MOSFET device 10. Further, as noted above with respect to FIG. 2, the source metallization 50 may include the source pad 60, which may be bonded to the source wire 80.

As discussed above with respect to FIG. 2, in some embodiments, the source metallization 50 and the gate metallization 52 may be formed simultaneously. For example, the aluminum layer 84 may be deposited on the surface 54 of the MOSFET device 10 and may be etched to form the source metallization 50 and the gate metallization 52 (not shown in FIG. 8). Accordingly, the aluminum layer 84 may be electrically connected to the gate electrodes 28 and electrically isolated from the contact regions 156 in areas of the MOSFET device 10 under the gate metallization 52.

In some embodiments, at least one sputtering parameter of the third set of sputtering parameters may be different from a corresponding sputtering parameter of the first set of sputtering parameters and the second set of sputtering parameters. By using at least one different sputtering parameter, the first, second, and third aluminum layer portions 170, 174, and 178 may have one or more different characteristics. For example, in some embodiments, the third set of sputtering parameters of the deposition step 126 may not include a bias voltage supplied to the MOSFET device 10 using the bias voltage supply 104. In other words, depositing (block 126) the third aluminum layer portion 178 may include stopping the supply of the bias voltage to the MOSFET device 10 using the bias voltage supply 104. As a result, the MOSFET device 10 may be electrically floating or at an electrical floating potential during the third deposition step 126.

By using the first and second bias voltages for the first and second deposition steps 122 and 124 and electrically floating the MOSFET device 10 during the third deposition step 126, the third aluminum layer portion 178 may have larger aluminum grains than the first and second aluminum layer portions 170 and 174. The larger grain size may reduce the step coverage of the third aluminum layer portion 178 as compared to the first and second aluminum layer portions 170 and 174. However, the third aluminum layer portion 178 may be softer than the first and second aluminum layer portions 170 and 174. Wires bonded to soft metals may have increased reliability and bond strength as compared to wires bonded to harder metals. Accordingly, it may be desirable to electrically float the MOSFET device 10 during the third deposition step 126 to form the third aluminum layer portion 178 with a greater softness than the first and second aluminum layer portions 170 and 174 such that the wire bond between the source wire 80 and the third aluminum layer portion 178 may have good reliability and bond strength.

In some embodiments, the third set of sputtering parameters of the third deposition step 126 may include a third power level supplied to the target 100, a third pressure within the sputtering chamber 96, and/or a third valve opening percentage of the valve 108. In certain embodiments, the third power level, the third pressure, and/or the third valve opening percentage may be approximately equal to the second power level, the second pressure within the sputtering chamber 96, and/or the second valve opening percentage of the valve 108, respectively. That is, in some embodiments, the power level, the pressure within the sputtering chamber 96, and/or the valve opening percentage of the valve 108 used to implement the second deposition step 124 may not be adjusted to implement the third deposition step 126. Thus, in some embodiments, the second and third power levels may be greater than the first power level. Additionally, in some embodiments, the third pressure within the sputtering chamber 96 and/or the third valve opening percentage may be approximately equal to the first pressure within the sputtering chamber 96 and/or the first valve opening percentage of the valve 108, respectively. In some embodiments, the third power level, the third pressure within the sputtering chamber 96, and/or the third valve opening percentage of the valve 108 may be different from (e.g., greater than or less than) the power level, the pressure within the sputtering chamber 96, and/or the valve opening percentage of the valve 108, respectively, used in the first and/or second deposition steps 122 and/or 124.

As noted above, the aluminum layer 84 has a thickness 184. Additionally, the aluminum layer 84 has a bottom thickness 186 in the openings 154 (e.g., trenches) formed in the surface 54. Accordingly, the step coverage of the aluminum layer 84 (e.g., in the active area 150 illustrated in FIG. 8) is the ratio or percentage of the bottom thickness 186 relative to the thickness 184.

The step coverage of the aluminum layer 84 achieved using the three deposition steps 122, 124, and 126 of the method 120 of FIG. 4 with the above described sputtering parameters (e.g., power level, bias voltage, and chamber pressure) is at least approximately 70%. In some embodiments, the step coverage of the aluminum layer 84 may be greater than or equal to approximately 75%, 80%, or 85%. In certain embodiments, the step coverage of the aluminum layer 84 may be between approximately 70% and approximately 90% or between approximately 75% and approximately 85%. In contrast, the step coverage of an aluminum layer deposited using conventional sputtering processes on the surface 54 discussed above with respect to FIG. 5 or on surfaces having similar topography (e.g., similar cell pitch, similarly sized openings, etc.) may be less than approximately 25%. Thus, by using the three deposition steps 122, 124, and 126 with the above described sputtering parameters, the resulting aluminum layer 84 may have significantly greater step coverage as compared to aluminum layers formed using conventional sputtering processes, which typically include only one or two sputtering steps as compared to the three deposition steps 122, 124, and 126 of the method 120 of FIG. 4 and which typically use lower power levels, lower bias voltages, and higher chamber pressures as compared to the power levels, bias voltages, and chamber pressures described above with respect to FIG. 4.

Figure 9:
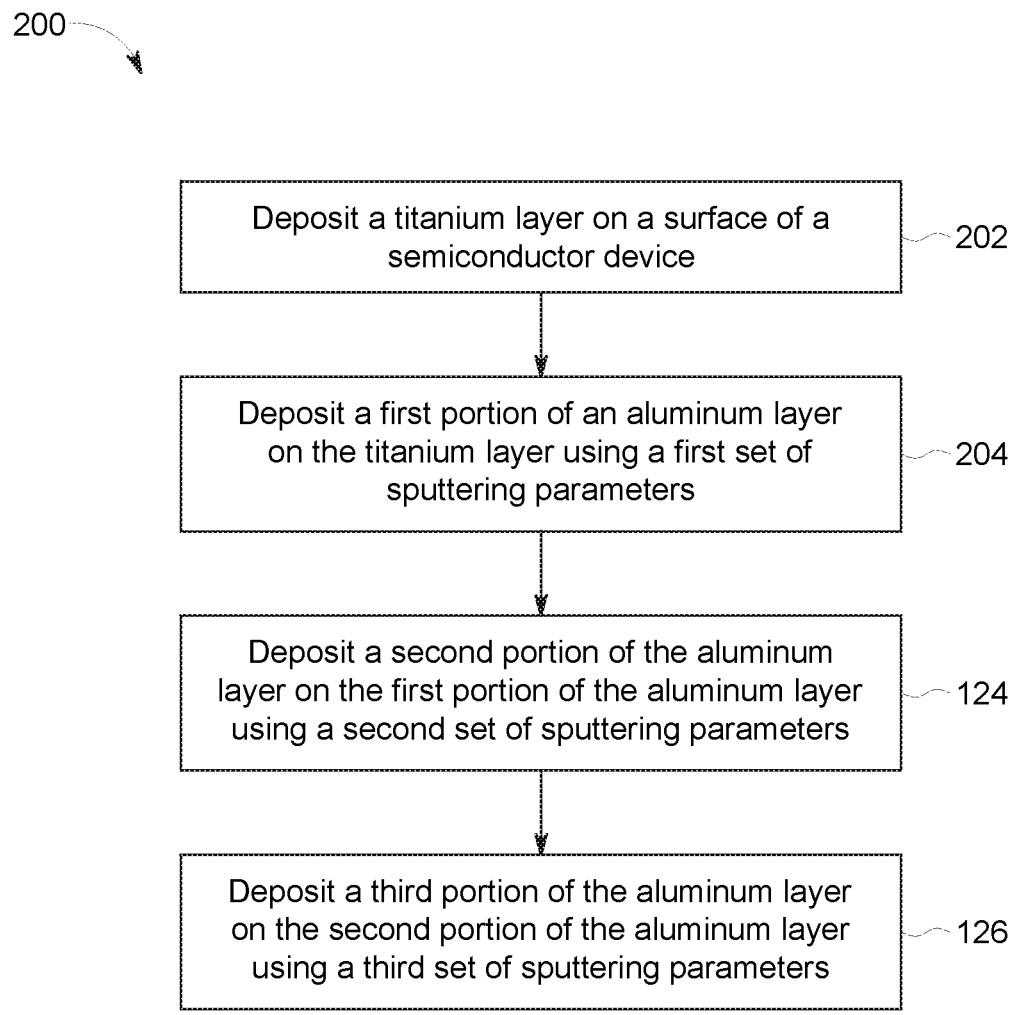
FIG. 9 is a flow diagram illustrating a method for depositing a titanium layer and an aluminum layer on a surface of a semiconductor device, in accordance with certain embodiments of the present approach.

As noted above with respect to FIG. 2, in some embodiments, the second metal layer 86 (e.g., a barrier metal layer) may be disposed between and adjacent to the surface 54 and the aluminum layer 84. In some embodiments, the second metal layer 86 may include a titanium layer. For example, FIG. 9, illustrates an embodiment of a method 200 for depositing a titanium layer on a surface of a semiconductor device, and subsequently depositing an aluminum layer on the titanium layer. The method 200 may be used to deposit the second metal layer 86 (e.g., a titanium layer) and the aluminum layer 84 of the source metallization 50 (e.g., the source pad 60) and/or the second metal layer 86 (e.g., a titanium layer) and the aluminum layer 84 of the gate metallization 52 (e.g., the gate pad 62) as illustrated in FIG. 2. It should be appreciated that the method 200 may be implemented using the PVD system 90 of FIG. 3 or any other suitable PVD (e.g., sputtering) system. For example, the PVD system 90 may utilize a titanium target 100 to deposit a titanium layer and an aluminum target 100 to deposit the aluminum layer 84.

The method 200 may include depositing (block 202) a titanium layer on the surface 54 of the MOSFET device 10. In some embodiments, the titanium layer may be deposited (block 202) directly on the surface 54 (see FIG. 5) of the MOSFET device 10. For example, the resulting structure, illustrated by the MOSFET device of FIG. 10, includes a titanium layer 220 disposed adjacent to (e.g., conformally deposited over) the surface 54 of the MOSFET device 10. In particular, the titanium layer 220 is disposed adjacent to the ILD layer 152 (e.g., portions of the ILD layer 152 adjacent to the gate electrodes 28 and portions of the ILD layer 152 adjacent to the semiconductor device layer 12) and in openings 154 formed in the ILD layer 152. More specifically, the titanium layer 220 is disposed adjacent to regions of the semiconductor device layer 12 exposed through the openings 154 of the ILD layer 152 (e.g., the contact regions 156 of the semiconductor device layer 12). In such embodiments, portions of the titanium layer 220 (e.g., portions of the aluminum layer 220 adjacent to the contact regions 156) may function as and be referred to as the source contacts 32 of the MOSFET device 10. In other words, the titanium layer 220 may include or may be integral with the source contacts 32. In other embodiments, the source contacts 32 may be formed separately from the titanium layer 220. For example, it may be desirable to form the source contacts 32 from one or more metals other than titanium, such as nickel. Accordingly, in such embodiments, the source contacts 32 may be disposed adjacent to the contact regions 156 of the semiconductor device layer 12, and the titanium layer 220 may be disposed on and adjacent to the source contacts 32.

Figure 10:
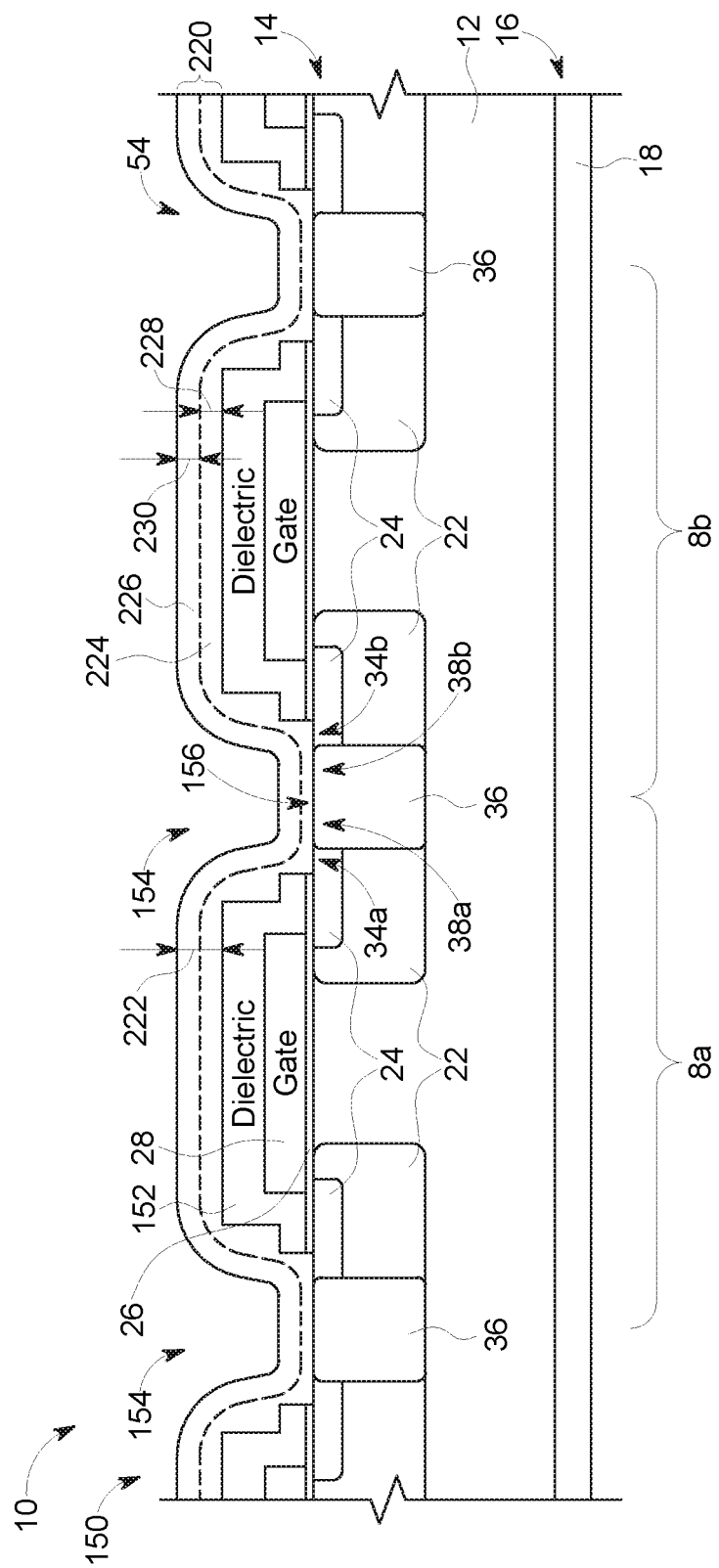
FIG. 10 is the MOSFET device embodiment of FIG. 5 after depositing a titanium layer on a surface of the MOSFET device, as set forth in the method of FIG. 9.

As illustrated in FIG. 10, the titanium layer 220 may have a thickness 222. In some embodiments, the thickness 222 may be between approximately 800 Angstroms (Å) and approximately 1200 Å, between approximately 900 Å and approximately 1100 Å, or between approximately 950 Å and approximately 1150 Å. In certain embodiments, the thickness 222 may be approximately equal to 1000 Å.

In certain embodiments, depositing (block 202) the titanium layer 220 may include depositing a first titanium layer portion 224 on the surface 54 of the MOSFET device 10 and depositing a second titanium layer portion 226 on the first titanium layer portion 224 using at least one different sputtering parameter. For example, in some embodiments, the first titanium layer portion 224 may be deposited by supplying a power to the target 100 (e.g., a titanium target) using the target power supply 102 with a power level that is approximately equal to 400 W. In certain embodiments, depositing the second titanium layer portion 226 may include increasing the power supplied to the target 100 using the target power supply 102. For example, in some embodiments, the second titanium layer portion 226 may be deposited by supplying a power to the target 100 with a power level that is approximately equal to 2800 W. Further, in some embodiments, the pressure within the sputtering chamber 96 when the first titanium layer portion 224 is deposited may be greater than the pressure within the sputtering chamber 96 when the second titanium layer portion 226 is deposited. For example, the pressure within the sputtering chamber 96 may be approximately equal to 30 mT when the first titanium layer portion 224 is deposited and may be approximately equal to 10 mT when the second titanium layer portion 226 is deposited. In certain embodiments, valve opening percentage of the valve 108 may be approximately equal to 30% when the first titanium layer portion 224 is deposited and may be approximately equal to 36% when the second titanium layer portion 226 is deposited. In some embodiments, the MOSFET device 10 may be electrically floating when the first and second titanium layer portions 224 and 226 are deposited.

Further, the first and second titanium layer portions 224 and 226 may have first and second thicknesses 228 and 230, respectively. In certain embodiments, the second thickness 230 may be greater than the first thickness 228. In some embodiments, the first thickness 228 may be between approximately 50 Å and approximately 150 Å or between approximately 75 Å and approximately 125 Å. In certain embodiments, the first thickness 228 may be approximately equal to 100 Å. Additionally, in certain embodiments, the second thickness 230 may be between approximately 800 Å and approximately 1000 Å or between approximately 850 Å and approximately 950 Å. In some embodiments, the second thickness 230 may be approximately equal to 900 Å.

Additionally, it may be appreciated that, in certain embodiments, after depositing the titanium layer (as set forth in block 202) and before depositing the first aluminum layer portion 170 (as set forth in block 204, discussed below), there may be an additional step in which a titanium alloy (e.g., titanium nitride) layer is formed on (e.g., deposited on, grown on) the titanium layer. For such embodiments, the titanium nitride layer may be disposed on and directly adjacent to the titanium layer, and disposed below and directly adjacent to the first aluminum layer portion 170.

Returning to FIG. 9, the illustrated method 200 includes depositing (block 204) the first aluminum layer portion 170 directly on (e.g., conformally over) the titanium layer 220 using the first set of sputtering parameters discussed above with respect to the deposition step 122 of FIG. 4. Additionally, the illustrated method 200 includes depositing (block 124) the second aluminum layer portion 174 directly on (e.g., conformally over) the first aluminum layer portion 170 using the second set of sputtering parameters and depositing (block 126) the third aluminum layer portion 178 directly on (e.g., conformally over) the second aluminum layer portion 174 using the third set of sputtering parameters, as discussed above with respect to FIG. 4. The resulting structure after the three aluminum deposition steps 204, 124, and 126, illustrated by the MOSFET device 10 of FIG. 11, includes the aluminum layer 84 disposed on and adjacent to the titanium layer 220. As discussed above, by forming the first, second, and third aluminum layer portions 170, 174, and 178 using the above described sputtering parameters, the step coverage of the resulting aluminum layer 84 may be at least approximately 70%, 75%, 80%, or 85%.

Figure 11:
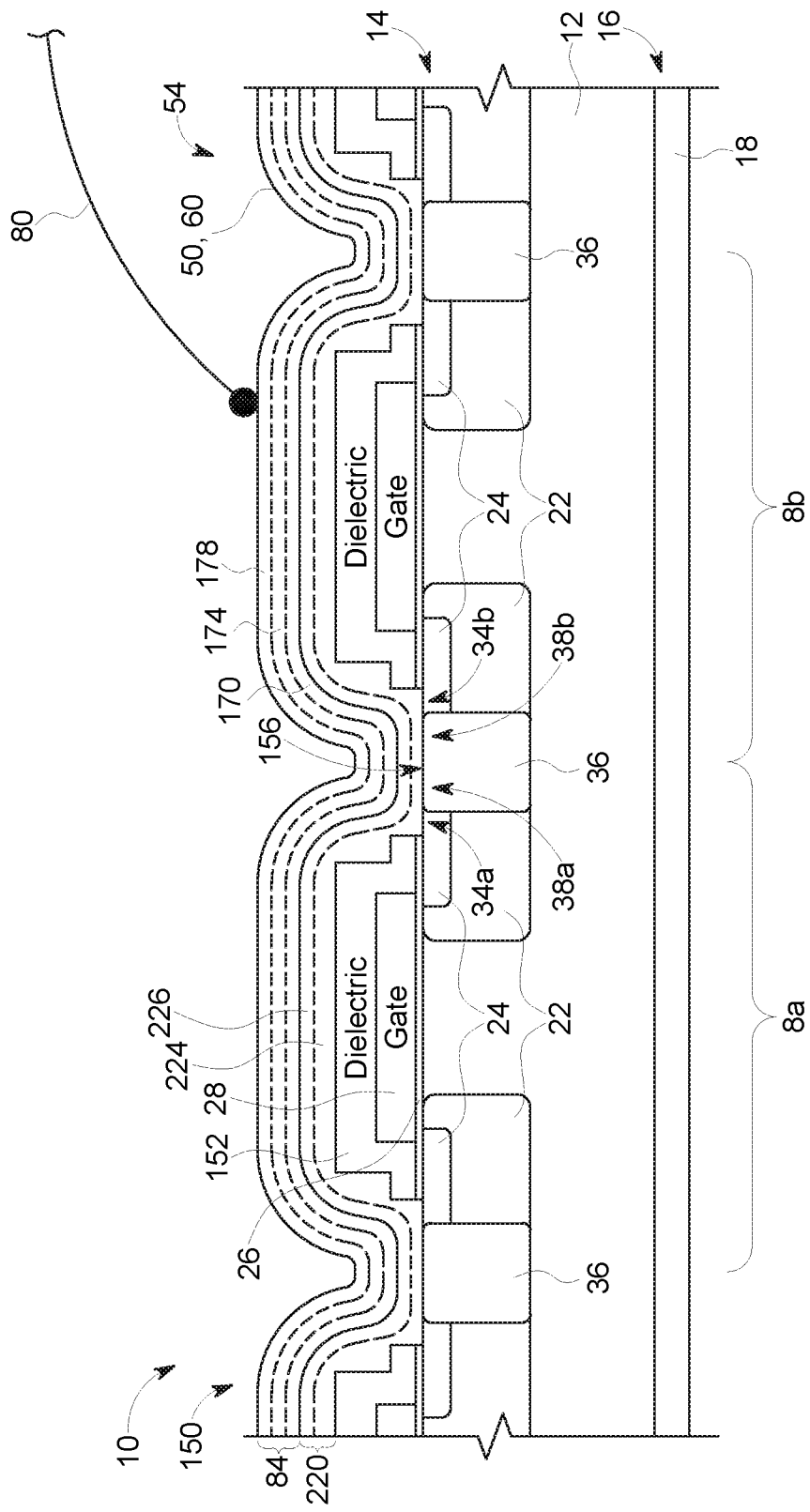
FIG. 11 is the MOSFET device embodiment of FIG. 5 after depositing an aluminum layer on the titanium layer, as set forth in the method of FIG. 9.

As will be appreciated, the aluminum layer 84 and the titanium layer 220 illustrated in FIG. 11 are electrically connected to one another and the contact regions 156 of the semiconductor device layer 12. Additionally, the aluminum layer 84 and the titanium layer 220 illustrated in FIG. 11 are electrically isolated from the gate electrodes 28 of the MOSFET device 10 via the ILD layer 152. Accordingly, the aluminum layer 84 and the titanium layer 220 illustrated in FIG. 11 may be referred to as the source metallization 50 of the MOSFET device 10. Further, as noted above, the source metallization 50 may include the source pad 60, which may be bonded to the source wire 80.

As discussed above with respect to FIG. 2, in some embodiments, the source metallization 50 and the gate metallization 52 may be formed simultaneously. For example, the aluminum layer 84 and the titanium layer 220 may be deposited on the surface 54 of the MOSFET device 10 and may be etched to form the source metallization 50 and the gate metallization 52 as discussed above with respect to FIG. 2. Accordingly, the aluminum layer 84 and the titanium layer 220 of the gate metallization 52 (e.g., the gate pad 62) may be electrically connected to the gate electrodes 28 and electrically isolated from the source metallization 50 (e.g., the source pad 60). Further, as discussed above with respect to FIG. 2, the aluminum layer 84 and the titanium layer 220 of the gate metallization 52 (e.g., the gate pad 62) may be electrically connected to the gate wire 82, which may be electrically connected to the gate lead 76 of the lead frame 68.

Technical effects of the invention include depositing an aluminum layer on a surface of a semiconductor device using three sputtering steps, where each sputtering step includes at least one sputtering parameter that is different from a sputtering parameter of another sputtering step. In particular, a first portion of the aluminum layer may be formed by supplying a power to an aluminum target at a first power level, supplying a bias voltage to the semiconductor device at a first bias voltage level, and supplying a sputtering gas to a sputtering chamber at a rate and/or pressure to create a first pressure within the sputtering chamber. Additionally, a second portion of the aluminum layer may be formed on the first portion of the aluminum layer by increasing the power supplied to the aluminum target to a second power level. In some embodiments, the second portion of the aluminum layer may be formed by maintaining the first bias voltage level and the first pressure within the sputtering chamber. Further, a third portion of the aluminum layer may be formed on the second portion of the aluminum layer by electrically floating the semiconductor device (e.g., stopping the supply of the bias voltage to the semiconductor device). In some embodiments, the third portion of the aluminum layer may be formed by maintaining the second power level and the first pressure within the sputtering chamber. The resulting aluminum layer may have improved step coverage as compared to aluminum layers formed using conventional sputtering methods and may enable adequate or improved reliability and bond strength of wires bonded to the aluminum layer.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor device, comprising:
   a semiconductor device layer comprising a first surface;
   a plurality of gate electrodes disposed on the first surface of the semiconductor device layer, wherein the plurality of gate electrodes are spaced apart from one another;
   a plurality of contact regions disposed in the first surface of the semiconductor device layer, wherein each contact region of the plurality of contact regions is disposed between adjacent gate electrodes of the plurality of gate electrodes;
   a dielectric layer disposed on and adjacent to each gate electrode of the plurality of electrodes, wherein the dielectric layer comprises a plurality of openings, wherein each opening of the plurality of openings is disposed over a contact region of the plurality of contact regions; and
   an aluminum layer disposed on the dielectric layer, wherein the aluminum layer extends into each opening of the plurality of openings of the dielectric layer such that the aluminum layer is disposed on the plurality of contact regions of the semiconductor device layer, wherein a cell pitch of the semiconductor device is between approximately 4.5 μm and approximately 8 μm, wherein each opening of the plurality of openings comprises a width and a height, wherein the width is less or equal to approximately 2 μm, wherein a ratio of the height to the width is between approximately 1:1 and approximately 5:1 and wherein a step coverage of the aluminum layer in each opening of the plurality of openings is greater than or equal to approximately 75%.

2. The semiconductor device of claim 1, wherein the step coverage of the aluminum layer is greater than or equal to 85%.

3. The semiconductor device of claim 1, wherein the ratio of the height to the width is between approximately 1.1:1 and approximately 1.2:1.

4. The semiconductor device of claim 1, wherein a thickness of the aluminum layer is between approximately 3 μm and approximately 5 μm.

5. The semiconductor device of claim 1, comprising a plurality of source contacts, wherein each source contact is disposed adjacent to a contact region of the plurality of contact regions, and wherein the aluminum layer is disposed on each source contact of the plurality of source contacts.

6. The semiconductor device of claim 1, comprising a titanium layer disposed on the dielectric layer, wherein the titanium layer extends into each opening of the plurality of openings of the dielectric layer such that the titanium layer is disposed on the plurality of contact regions of the semiconductor device layer, and wherein the aluminum layer is disposed on the titanium layer.

7. The semiconductor device of claim 6, comprising a titanium nitride layer disposed between and adjacent to the titanium layer and the aluminum layer.

8. The semiconductor device of claim 6, wherein the titanium layer is disposed adjacent to each contact region of the plurality of contact regions.

9. The semiconductor device of claim 6, comprising a plurality of source contacts, wherein each source contact is disposed adjacent to a contact region of the plurality of contact regions, and wherein the titanium layer is disposed on and adjacent to each source contact of the plurality of source contacts.

10. The semiconductor device of claim 1, wherein the semiconductor device layer has a first conductivity type, and wherein the semiconductor device layer comprises:
    a plurality of source regions having the first conductivity type implanted in the semiconductor device layer; and
    a plurality of well regions having a second conductivity type implanted in the semiconductor device layer adjacent to the plurality of source regions, wherein each contact region of the plurality of contact regions is a region of the first surface of the semiconductor device layer that comprise a portion of at least one source region of the plurality of source regions, a portion of at least one well region of the plurality of well regions, or both.

11. The semiconductor device of claim 1, wherein the semiconductor device is a MOSFET or JFET device.

12. The semiconductor device of claim 11, wherein the semiconductor device layer is a silicon carbide semiconductor device layer.

* * * * *